United States Patent
Ho et al.

(10) Patent No.: US 8,749,309 B2
(45) Date of Patent: Jun. 10, 2014

(54) GATE-BASED OUTPUT POWER LEVEL CONTROL POWER AMPLIFIER

(75) Inventors: Daniel Ho, Palo Alto, CA (US); Stephen Franck, Felton, CA (US); Ying Shi, Sunnyvale, CA (US); Baker Scott, San Jose, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 45 days.

(21) Appl. No.: 13/310,544

(22) Filed: Dec. 2, 2011

(65) Prior Publication Data

US 2012/0139635 A1    Jun. 7, 2012

Related U.S. Application Data

(60) Provisional application No. 61/419,860, filed on Dec. 5, 2010.

(51) Int. Cl.
   *H03G 3/10*   (2006.01)
(52) U.S. Cl.
   USPC .......................................... 330/285; 330/296
(58) Field of Classification Search
   USPC ................... 330/285, 296, 279, 311
   See application file for complete search history.

(56) References Cited

U.S. PATENT DOCUMENTS

| | | | |
|---|---|---|---|
| 4,510,460 A | 4/1985 | Tamura | |
| 5,942,946 A | 8/1999 | Su et al. | |
| 6,107,872 A | 8/2000 | Schoepe et al. | |
| 6,522,201 B1 | 2/2003 | Hsiao et al. | |
| 6,624,702 B1 | 9/2003 | Dening | |
| 6,646,501 B1 | 11/2003 | Wessel | |
| 6,701,138 B2 | 3/2004 | Epperson et al. | |
| 6,781,455 B2 | 8/2004 | Kim | |
| 6,784,740 B1* | 8/2004 | Tabatabaei | 330/279 |
| 6,816,016 B2 | 11/2004 | Sander et al. | |
| 6,825,719 B1 | 11/2004 | Barak et al. | |
| 6,864,668 B1 | 3/2005 | McCune et al. | |
| 6,914,482 B2* | 7/2005 | Ichitsubo et al. | 330/129 |
| 7,123,088 B2* | 10/2006 | Ichitsubo et al. | 330/129 |
| 7,193,459 B1 | 3/2007 | Epperson et al. | |
| 7,196,583 B2 | 3/2007 | Clifton et al. | |
| 7,205,842 B2* | 4/2007 | Gustavsson et al. | 330/279 |
| 7,248,111 B1 | 7/2007 | Xu et al. | |
| 7,330,071 B1 | 2/2008 | Dening et al. | |
| 7,333,563 B2 | 2/2008 | Chan et al. | |
| 7,397,309 B2* | 7/2008 | Tanoi | 330/296 |
| 7,420,421 B1 | 9/2008 | Lie et al. | |
| 7,436,257 B2 | 10/2008 | Park et al. | |
| 7,439,809 B2 | 10/2008 | Iwata et al. | |
| 7,545,217 B1 | 6/2009 | Reyes | |

(Continued)

OTHER PUBLICATIONS

Kim, Bumman, et al., "Advanced Doherty Architecture", *IEEE Microwave Magazine*, (Aug. 2010), pp. 72-86.

*Primary Examiner* — Henry Choe
(74) *Attorney, Agent, or Firm* — Withrow & Terranova, P.L.L.C.

(57) ABSTRACT

A gate power control technique for a power amplifier (PA) provides practical improved efficiency at backed-off power levels. It can be applied to the main gate of the output stage of the PA, the cascode gate, or any combination thereof. Both voltage mode and current mode signal processing may be used. The gate power control can be implemented in both open-loop and closed-loop using AC and DC coupled drivers and output stages. It may further use one or more control ports in the radio frequency (RF) signal path.

15 Claims, 10 Drawing Sheets

(56) References Cited

U.S. PATENT DOCUMENTS

| | | |
|---|---|---|
| 7,714,664 B2 * | 5/2010 | Kanaya et al. ............... 330/311 |
| 7,782,133 B2 | 8/2010 | Bakalski et al. |
| 7,787,566 B2 | 8/2010 | Chan et al. |
| 7,817,973 B1 | 10/2010 | Tuo |
| 2003/0016082 A1 | 1/2003 | Matsunaga et al. |
| 2003/0222709 A1 | 12/2003 | Kim |
| 2004/0183593 A1 | 9/2004 | Kwon et al. |
| 2004/0212436 A1 | 10/2004 | Matsunaga et al. |
| 2004/0217818 A1 * | 11/2004 | Lin et al. ............... 330/296 |
| 2004/0227576 A1 * | 11/2004 | Vice ............... 330/285 |
| 2004/0251962 A1 | 12/2004 | Rosnell et al. |
| 2005/0151586 A1 | 7/2005 | Grillo et al. |
| 2006/0135096 A1 | 6/2006 | McCune |
| 2006/0197600 A1 | 9/2006 | Matsunaga et al. |
| 2006/0293002 A1 | 12/2006 | McCune |
| 2006/0293003 A1 | 12/2006 | McCune |
| 2008/0171523 A1 | 7/2008 | Anderson et al. |
| 2009/0245409 A1 | 10/2009 | Kandukuri Narayan et al. |
| 2009/0309661 A1 | 12/2009 | Chang et al. |
| 2010/0194481 A1 | 8/2010 | Hase et al. |
| 2011/0058601 A1 | 3/2011 | Kim et al. |

* cited by examiner

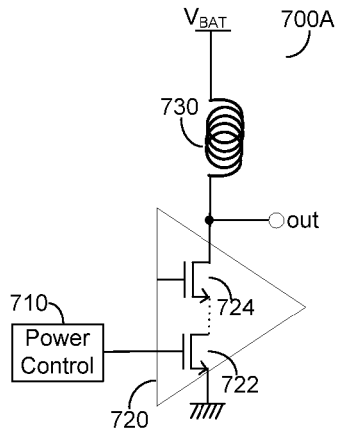
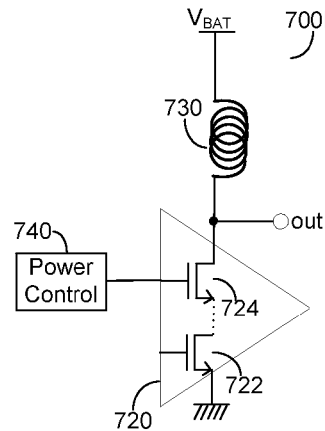
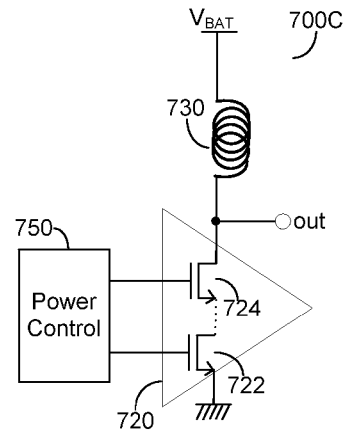
FIGURE 7A     FIGURE 7B     FIGURE 7C
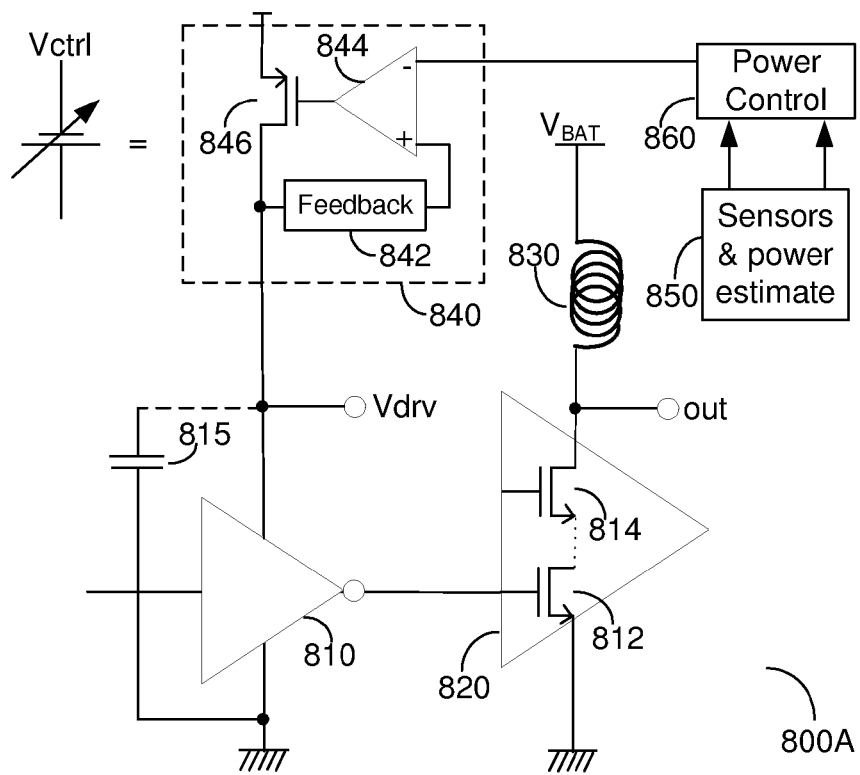
FIGURE 8A though in some embodiments it may use DC coupled drivers only. Furthermore, current mode may be used for different techniques as illustrated in detail below. It should be noted that in the various figures like reference numerals refer to identical elements.

GATE-BASED OUTPUT POWER LEVEL CONTROL POWER AMPLIFIER

CROSS-REFERENCE TO RELATED APPLICATIONS

This application claims the benefit of U.S. Provisional Patent Application No. 61/419,860 filed Dec. 5, 2010.

BACKGROUND OF THE INVENTION

1. Field of the Invention

The invention generally relates to power amplifier output power level control and more specifically to power control of the output power amplifier of a power amplifier system by its input gate.

2. Prior Art

Power amplifiers for constant envelope signal modulation application require a mechanism for regulating their output power level based on an input signal (Vramp) provided by the transmit block. One possibility is that the output power is sensed by a directional coupler followed by a radio frequency (RF) power detector. A feedback loop is locked around the PA by comparing the targeted power level Vramp with the sensed power level Psense. The error signal provided by the error amplifier is sent to the power control block which generates one or more control signals. The control signals are usually voltages, but in some cases may be also other quantities. The main drawback of the directional coupler based power control is its very large size and cost due to the directional coupler. Such a solution has hard time of meeting the demanding and continuous cost reduction of the consumer products market.

Instead of sensing directly the output power, another widely used technique is sensing separately the baseband output voltage (Vout) and the baseband output current (Iout) and use them to drive the supply regulator that biases the PA through a large value inductance. Using the regulator to set the PA output power level has the advantage of dealing with baseband quantities in contrast with the RF quantities involved in the directional coupler technique. This allows a simple and easier routing and signal processing. The comparison between the targeted (Vramp) power level and the sensed power level (Psense) given by the baseband voltage (Vsense) and current (Isense) levels is done with an error amplifier that drives the gate of the large size metal-oxide semiconductor (MOS) output device of the regulator. The baseband output voltage (Vsense) is available directly at the regulator output, which the baseband current (Isense) can be sensed, for example, by using a sense low value resistance. Such resistance needs also to pass the high current, hence a high cost. The main drawback of this regulator, or alternatively DC-DC converter supply modulation or drain power control technique, is its large area and thus cost, brought by a very large power control device that is connected in series with the high current high power output signal path.

As shown in FIG. 1, the supply voltage (Vsupply) 130 applied to the PA output stage 110 through the choke inductor 120 is changed in accordance with the Vramp signal that gives the targeted output power level. As mentioned before, the main drawback of this technique is that the power control block 130 is placed in the path of the high value output current and therefore the power control devices connected in series with the PA 114 need to be very large, impacting cost. Furthermore, placing the power control block in series with the high current path results in power losses, and thus efficiency degradation.

The efficiency decay is more pronounced at the backed-off output power levels when a large percentage of the battery supply $V_{BAT}$ is dropped across the supply modulator 132. Since PA 114 usually operates most of the time at power levels lower than the peak rated power, the degraded efficiency of backed-off power levels results usually in a lower talk time as a given battery charge.

Therefore, in view of the deficiencies of the prior art, it would be advantageous to provide a solution that overcomes these deficiencies.

BRIEF DESCRIPTION OF THE DRAWINGS

FIG. 7A is a block diagram of a main gate of gate power control according to the principles of the invention.

FIG. 7B is a block diagram of a cascode gate of gate power control according to the principles of the invention.

FIG. 7C is a block diagram of a hybrid main and cascode gate of gate power control according to the principles of the invention.

FIG. 8A is a block diagram of a last driver stage voltage control technique according to the principles of the invention.

DETAILED DESCRIPTION OF THE PREFERRED EMBODIMENTS

A gate power control technique for a power amplifier (PA) provides practical improved efficiency at backed-off power levels. It can be applied to the main gate of the output stage of the PA, the cascode gate, or any combination thereof. Both voltage mode and current mode signal processing may be used. The gate power control can be implemented in both open-loop and closed-loop using AC and DC coupled drivers and output stages. It may further use one or more control ports in the radio frequency (RF) signal path.

Figure 1:
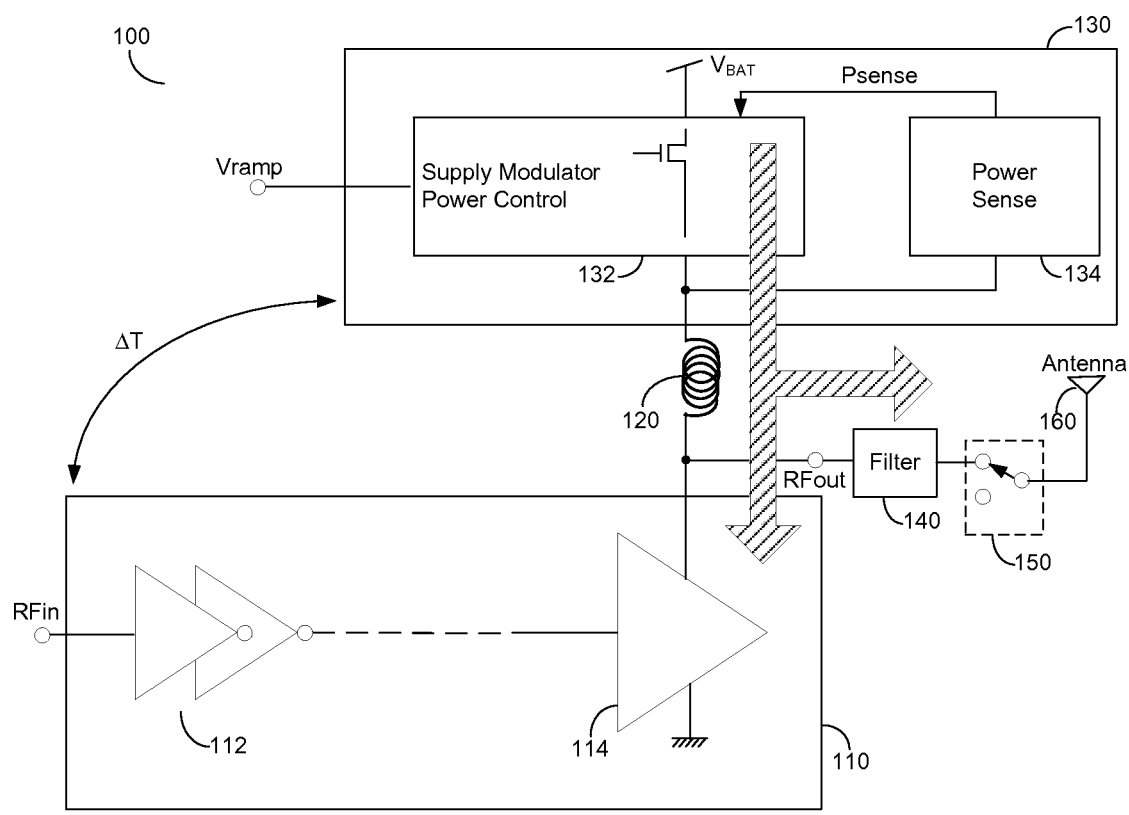
FIG. 1 is a block diagram of a power amplifier with a drain power control.
Figure 2:
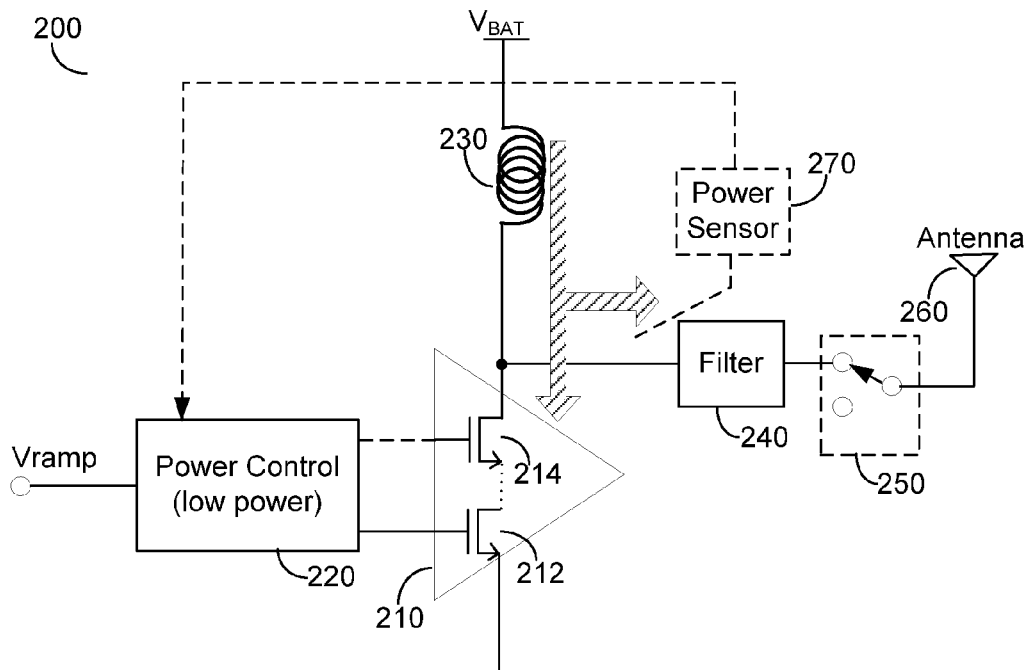
FIG. 2 is a block diagram of the principle of gate power control.

Reducing the size and cost of PA systems requires the elimination of the larger supply modulation block needed for the drain (collector) power control. The key idea of this invention is to move the power control block out of the high output current path and to a low current node, as shown in the exemplary and non-limiting FIG. 2. The power control block 220 provides the DC operating conditions of the main gate 212 of the metal-oxide semiconductor (MOS) output stage 210 and optionally the gate 214 of one or more of cascode devices. Cascode devices 214 are usually used to share the output voltage swing with the main transconductance device 212 which reduces the voltage stress at high output power levels. It should be noted that in the art MOS transistors are also referred to as MOS filed-effect transistors MOSFET, however, for simplicity of the invention the term gate is used to denote the gate terminal of a MOSFET transistor.

The power level at the gate of the output stage is much lower (one or more orders of magnitude) when compared with the power handled by the output stage itself. Therefore, the devices used in the power control block 220 can be much smaller than the ones used by the supply modulator of the prior art drain power control technique. This reduces the area and cost of implementing the power control scheme using a gate control technique. The gate power control may be an open-loop scheme, when the power control block 220 is driven only by the Vramp targeted power level and the PA signal path is controlled in a feed-forward fashion.

Alternatively, the gate control scheme may be implemented in a closed loop fashion, where a power sensor 270 measures the output power delivered by the PA 210 to a load, e.g., antenna 260, which is compared with the target power level by the power control block 220 and the error signal is used to close the PA power control feedback loop. The main advantage for the feedback power control technique is its increased accuracy in sensing the output power level. Since the sensors, power estimation and error signal calculation circuits take a relatively low area the feedback power control technique delivers a good cost-performance tradeoff.

The main challenge for the gate power control is that the drain of the output stage is connected directly to the battery through a large value inductance and therefore only the RF output voltage and current are available, i.e., no baseband versions are directly available. Therefore the output sensors need to perform the RF to baseband conversion. However, such RF sensors usually take much lesser area and power when compared with the supply modulator techniques.

Figure 3A:
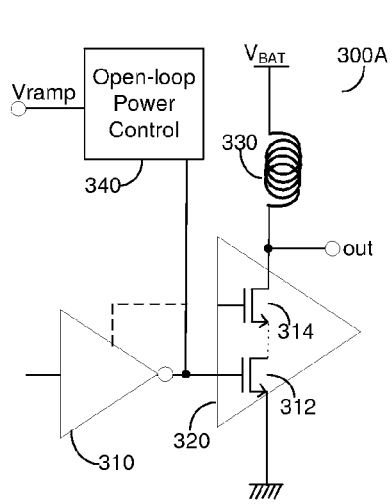
FIG. 3A is a block diagram of an open-loop (feed forward) gate power control.
Figure 3B:
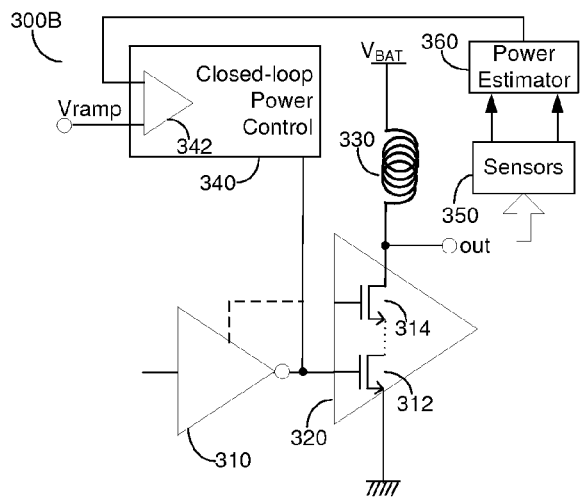
FIG. 3B is a block diagram of a closed-loop (feedback) gate power control.

There are two main ways of implementing a gate-based power control that are shown in the exemplary and non-limiting FIGS. 3A and 3B. It can be done in an open loop fashion as shown in FIG. 3A, where no output sensors are used and thus the power control block 340 has no knowledge of the real power level at the output of the PA 320. The power control block takes the targeted power level (Vramp) as input and generates the control signals for the output stage 320 and optionally to one or more driver stages 310 using a prescribed dependence. This can be linear, but in most cases is nonlinear to improve the PA 320 efficiency at backed-off power levels. The feed-forward generation of the control curves is simple and easy to implement but it suffers of modest accuracy. The error between the targeted (Vramp) and the realistic output power level (Pout) can be as large as a few [dB]. To reduce this difference, each PA needs to be calibrated. Also, it is important that the PA has a good stability of the power control over a wide temperature range. Such a relatively low accuracy power control scheme may be acceptable in multi-needs, e.g. WCDMA and GSM, PA systems that need to ensure legacy compatibility with the GSM constant envelope mode.

The accuracy of the power control can be significantly improved by using a feedback technique, as shown in FIG. 3B. The output power level is sensed with a sensor block (one or more) 350 and the power level is computed by a power estimation block 360. The targeted (Vramp) and the estimated output power level (Pout) are compared and the error signal is used to drive the power control 340 in the direction of minimizing the error term. Therefore, the feedback loop will settle at a power level very close to the targeted level. The feedback power control technique uses an extra sensor block 350, power estimation block 360 and error amplifier 342. Although such blocks have some additional area penalty, they are not the dominant area consuming blocks. The higher accuracy is usually worth the extra area.

The open loop control block may generate either voltage or current control signals. The control may be applied directly to the gate at the output stage or via the last driver. Additional control signals may be used for the cascode nodes of the output stage and even some front-end driven stages. A typical Pout(Vramp) characteristic variation over process corners may have much variation due to the open loop control. However, a calibration process may eliminate most of the error. Any residual error due to calibrations will add to the temperature and supply variations of the control characteristics to give the overall power setting error. It is critical for the open loop technique to keep the environment variability (temperature, supply, etc.) at very small levels so as to ensure a certain power setting accuracy after the calculation of the process variation component. For an open loop power control scheme it is very important to reduce a control characteristic that has a very good stability with the environment changes (temperature, supply voltage, etc.). Although the process variation is mostly cancelled by the calibration, it is advantageous to have a rather small process variation to begin with. This simplifies the calibration process and reduces its required coverage range.

In other words the current into the amplifier 310 is increased or decreased as necessary and that impacts the output power. Hence, by controlling the current going into the inverting amplifier 310 the output voltage is controlled too. That way the gate voltage of transistor 312 of the output amplifier 320 is controlled. A person of ordinary skill in the art would readily appreciate that the open loop is a less effective solution because it is trying to predict but without the feedback (shown in 3B) the correction capabilities are limited, but the solution is simpler and in some cases sufficient. With respect of FIGS. 3A and B it should be further appreciated that a change is possible at the bias point of the gate of 312 or at the current into the amplifier 310. It is also possible to change the bias to transistor 314 if so desired.

One of ordinary skill in the art would readily appreciate that concern for linearity in a GSM-based solution is limited to the power ramp-up and power ramp-down phase. Other than during those periods there is a constant amplitude signal and hence linearity is not a stringent requirement for the output stage. Notably there is only a rotation of the phase of the signal. However, any type of power feedback such as those shown hereinabove linearize the output stage. Therefore any linearity error in the output stage is offset by the feedback, for example in a circuit as shown in FIG. 3B. In a case of an open loop solution such as shown with respect of FIG. 3A the ramp may take into account the expected transfer function and that would be good enough.

The cascode final stage comprises of the transistors 312 and 314 etc. shown in FIGS. 3A and 3B. Generally 314 is kept on a low bias and that reduces the output capacitance seen through 312. This is done efficiency reasons so as not to move it through the various regions of operation. As the ramp increases the gate bias of 314 can slightly increase. If there are multiple transistors then the bias of the other transistors are raised as well. This works for a GSM output stage and the idea is to keep the bias low that reduces the output capacitance. In some cases when moving between low power and high power the capacitance may change and cause a distortion. So in a linear amplifier it may be better to hold the bias constant to help tune out the distortion. So in a GSM product where the linearity, as noted above, is of less concern, but efficiency is of higher concern, biasing of the transistors of the cascade changes. When linearity is concerned but demand for efficiency is lesser then bias is kept constant which reduces the non-linearity. The cascade solution allows use of stacked devices which are compatible with standard MOS processes and reduce the size of the PA because of the use of the stacking of devices. The transistor 314 or more, if necessary, are DC biased only (not connected to the output of 310), however, the biasing may be at least somewhat proportional to the input signal to 312. If necessary the gate of 314 may be biased to a voltage above the rail to accommodate for a larger output swing. This is of course not necessary at the low power. It is necessary to make sure that the transistors of 314 have enough voltage to operate also when operation is at a lower input signal.

Figure 4A:
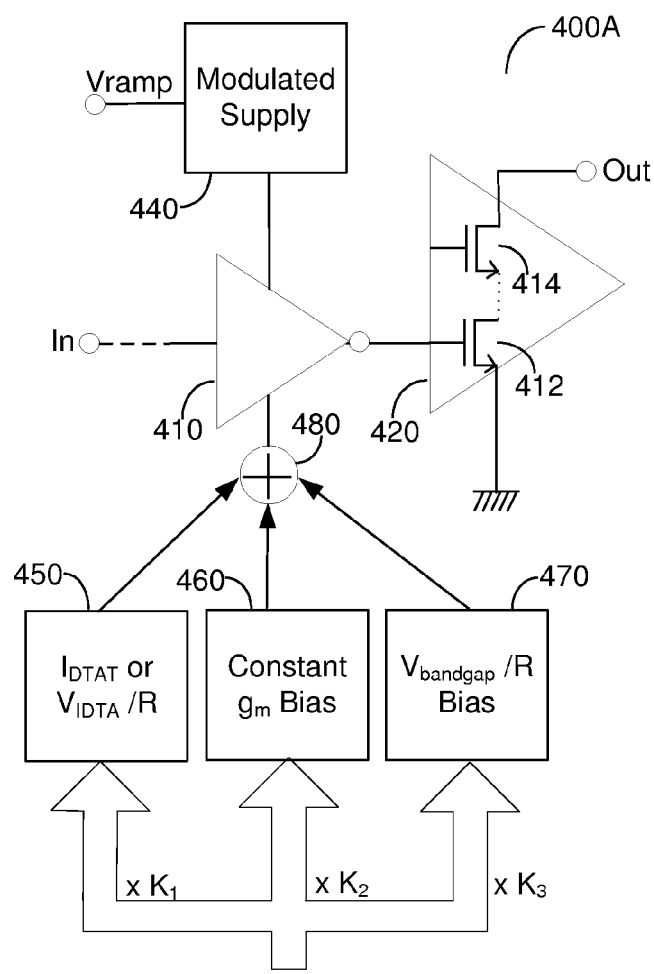
FIG. 4A is a block diagram of a circuit for compensation for temperature variations of an open-loop control.

FIG. 4A depicts an exemplary and non-limiting block diagram 400A of a circuit for compensation for temperature variations of an open-loop control. Shown is one possible technique to ensure a low process supply voltage and temperature variation of the control characteristics. The gate control voltage of the output stage 420 is generated by the last driver 410 which has its supply modulated by the power signal (Vramp). One key technique to minimize the variability of the control curve is to use a last driver 410 that has a constant transconductance ($g_m$) bias 460 method. In order to further tune the temperature variation of the control curve, a secondary proportional to absolute temperature (PTAT) bias generator 450 can be used. Constant offsets may be integrated with bandgap voltage bias generator 470. The different bias signals of the driver 410 are summed together 480. In most cases using a current mode summation is free since it can be done without any additional element, by simply connecting together the different bias currents.

Figure 4B:
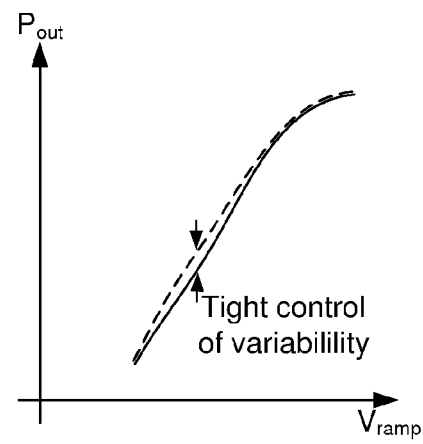
FIG. 4B is a graph for control curves for an open-loop control.

As shown in FIG. 4B the resulting open loop power control characteristic Pout(Vramp) has a much higher variability and therefore it is easier to implement a robust and reliable calibration process. Achieving a low variability power control characteristic mandates a good matching between the RF signal path and the power control devices. This minimizes the mismatch generated effects. It is often important the RF and power control path devices are at approximately the same temperature. This averts the temperature generated effects. Due to these requirements, the open loop power control favors a single chip integration of the RF signal path and the power control block. Other types of bias generators may be used to ensure a low variability of the open loop power control characteristics Pout(Vamp).

Figure 5:
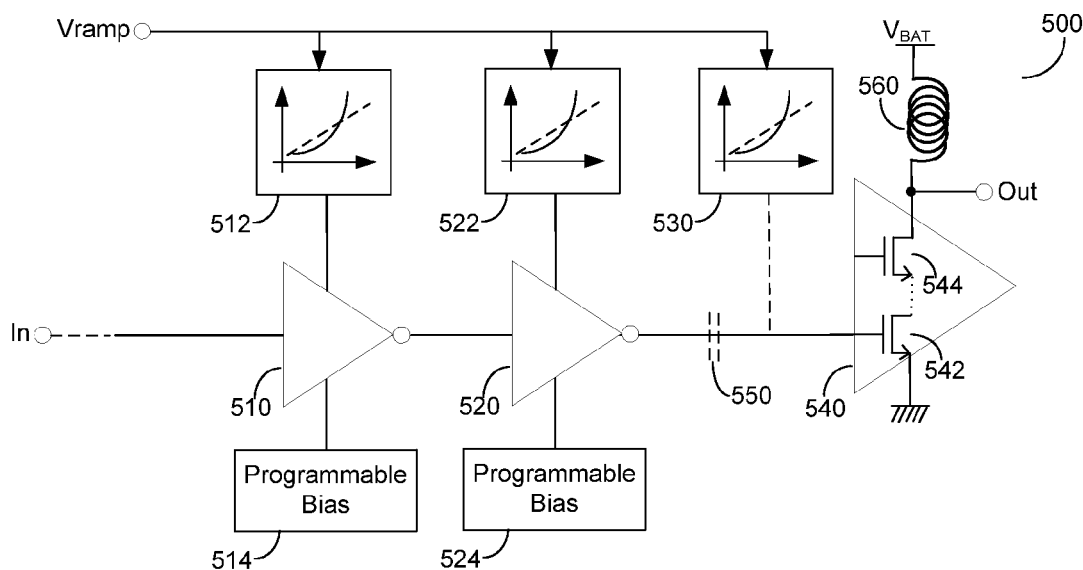
FIG. 5 is a block diagram of an open-loop gate power control using multiple control ports.

FIG. 5 illustrates a block diagram 500 of an open-loop gate power control using multiple control ports. Although in its simplest implementation the gate control may involve a single control, it is advantageous to have one or more control ports. The Vamp target power signal controls in a feed-forward fashion: the pre-driver 510 with the control curve generator 512, the driver 520 with the control curve generator 522, and the gate 542 of the output stage 540 with the control curve generator 530. The control curve may have a linear dependency on Vramp, a piece-wise linear characteristic, or yet it may have a continuously nonlinear characteristic. If the output stage 540 is DC coupled with last driver 520 then the gate control comes directly from the driver control. If the output stage 540 is AC coupled using a coupling capacitor 550, then in addition to the control curve for the last driver generated by 522 a supplementary control curve generator 530 for the gate of the output stage needs to be used. The drivers may have adjustable (programmable) bias stages 514 and 524 that have as a goal the minimizing of the variability of the open loop power control characteristics.

Figure 6:
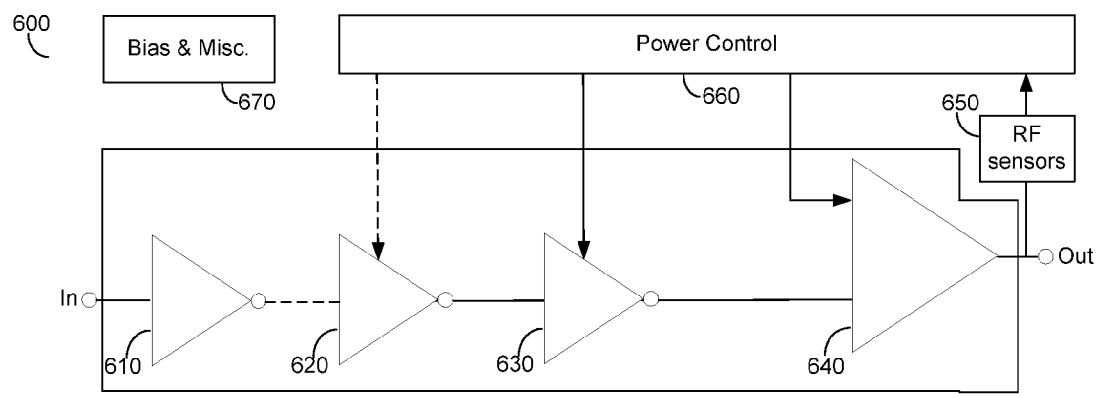
FIG. 6 is a block diagram of the advantages of a single chip RF power control and bias for the PA power control.

FIG. 6 shows an exemplary and non-limiting top level diagram of a PA 600 using a gate power control scheme and uses a single chip integration of the RF path and the control block. There are several advantages for using a single chip PA integration coupled with a gate power control. First and foremost, there are no speed issues with the RF sensors due to the off chip interface lines. Therefore the RF sensing, as mandated by the gate power control scheme, work perfectly with the single chip solution. Second, the single chip integration brings a tight temperature tracking between the curves in the RF signal path and the devices in the power control block 660. This minimizes the temperature generated effects. Third, there will be a good matching between the devices used by the RF signal path and the devices from the power control block 660. This allows the use of replica biasing schemes which minimizes the effects of the power control scheme. Lastly, but not least, having a single chip solution allows an easy use of multiple control parts in the RF signal path, which can optimize the RF efficiency at backed-off power level.

Bipolar implementations of the output stage, e.g., GaAs, SiGe, InP, etc., usually use a single device since it can take the entire hit of the peak output voltage amplitude. Since MOSFETs have relative low breakdown voltages, e.g. 3.5V to 4V for a 0.35 µm process, several devices can be stacked in order to withstand the peak output voltage values. Such cascode stages may use two or more devices and they may be of the same type, e.g., all high voltage FETs, or they may be hybrid implementations where some devices are low voltage and some of them are high voltage. A cascode output stage has multiple gate nodes that need to be biased and this will open the opportunity of having multiple power control paths. FIGS. 7A, 7B and 7C show several embodiments of the gate power control technique.

FIG. 7A depicts an exemplary and non-limiting block diagram 700A of a main gate 722 of gate power control according to the principles of the invention. Here only the main gate 722 of the output stage 720 is controlled by the power control block 710. FIG. 7B depicts an exemplary and non-limiting block diagram 700B cascode gate of gate power control according to the principles of the invention. The cascode gate 724 (may be one or more cascode gates) of the output stage 720 are controlled by the power control block 740. FIG. 7C depicts an exemplary and non-limiting block diagram 700C of a hybrid main and cascode gate of gate power control according to the principles of the invention. In this case a hybrid of main gate 722 and cascode gate 724 power control is used. When more than one gate is used in the power control scheme, the control range is usually extended and in some cases the linearity of the control characteristics may be improved. Other benefits of the main and cascode gate control are better efficiency of backed-off power levels and potentially better performance and lower device stress over a wide supply voltage range, if the appropriate control curves are used.

Figure 8B:
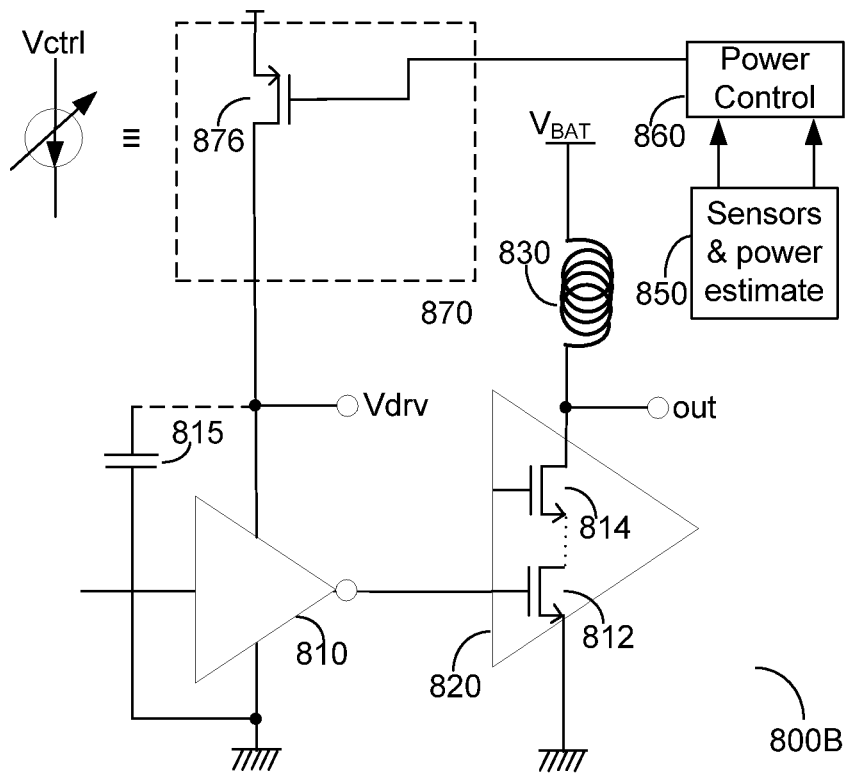
FIG. 8B is a block diagram of a last driver stage current control technique according to the principles of the invention.

There are two main ways to realize the gate power control as shown in the exemplary and non-limiting FIGS. 8A and 8B. In FIG. 8A the power control block is a variable supply voltage Vdrv 840 for the last driver 810 which is passed directly to the gate 812 of the output stage 820 for the DC coupling case or use a separate bias circuit for the AC coupling case. Alternatively, as shown in FIG. 8B, the last driver 810 can be biased with an adjustable bias current Idrv 870. A plurality of sensors 850 may be used for the purpose of enabling the operation of the power control unit 860. Such sensors include, but are not limited to, load impedance sensor, temperature sensor, phase angle sensor, supply voltage sensor, manufacturing process sensor, power range sensor, and frequency range sensor. The output of each of such sensor may have an impact on the control of the variable supply voltage 840 under control of the power control unit 860.

Figure 9A:
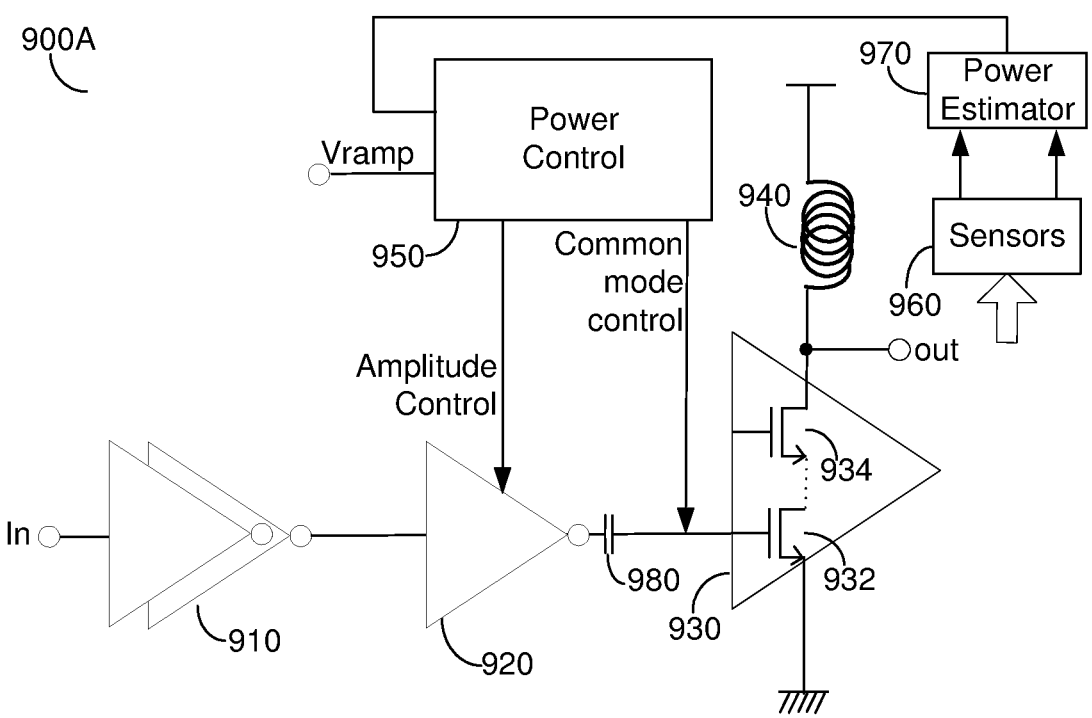
FIG. 9A is a PA gate power control for AC coupled driver output stage.

The easiest way to connect the last driver 920 to the output stage 930 is using an AC coupling capacitor 980 as shown in the exemplary and non-limiting FIG. 9A. The ease comes from the fact that the bias point of the two stages is independent and they can be separately optimized for best performance. The price paid for this ease is the need for a large value coupling capacitance 980 that may take large area and a sizable signal loss on this matching coupling capacitance if it is not much larger (one order of magnitude or more) than the input capacitance of the output stage. Since the gate control of the output stage requires both the common mode value and the amplitude of the driving signal to have a certain value, in the AC coupling case two separate controls, i.e., control curves, need to be generated for the last driver 920. These set the amplitude and common mode for the gate of the output stage 930 after the AC coupling capacitor 980. This may complicate somewhat the power control circuitry and requires a good correlation between the two control parts.

Figure 9B:
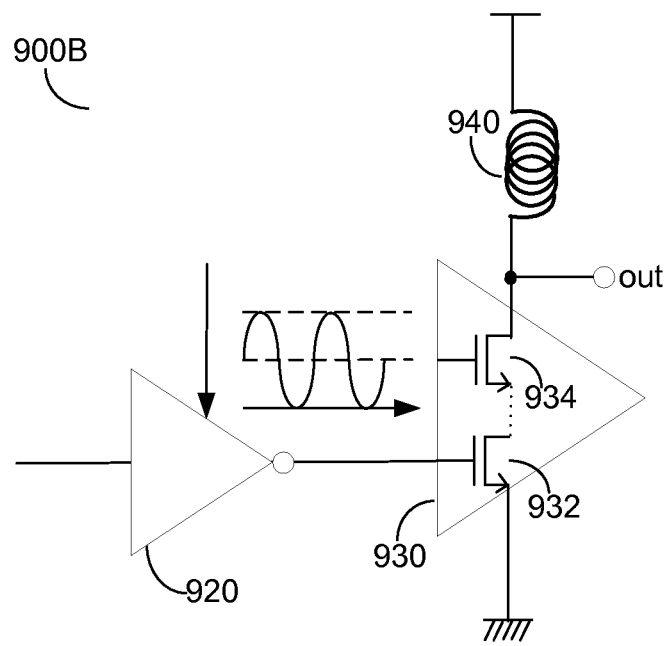
FIG. 9B is a PA gate power control for DC coupled driver output stage.

FIG. 9B shows a principal top level diagram 900B of a gate power control scheme implemented for the case of a DC coupling between the last driver 920 and the output stage 930. The main advantages of such techniques are lower area (no large size floating capacitors) and no signal loss at the driver-output stage interface. Since the output stage 930 gate voltage is the same as the last driver 920 output voltage only a single control curve generator for the driver supply is needed. This simplifies somewhat the power control scheme. However a much closer control of the signal duty cycle (and duty cycle distribution) is required since this is setting the DC common mode voltage at the gate of the output stage. From this perspective it may be more challenging to design the DC coupling correctly. In this case the size of the devices from the last driver will play a major role in the performance of the output stage. This offers supplementary ways to optimize the PA performance via device biasing.

Figure 10A:
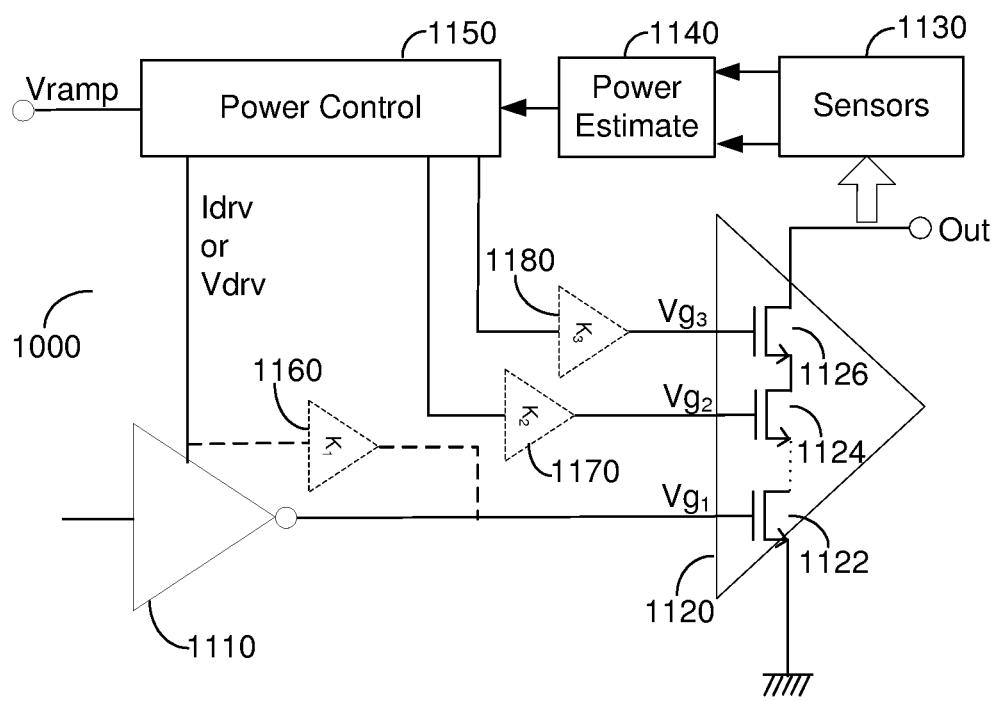
FIG. 10A is a block diagram of a gate power control scheme using multiple control ports in the signal path.
Figure 10B:
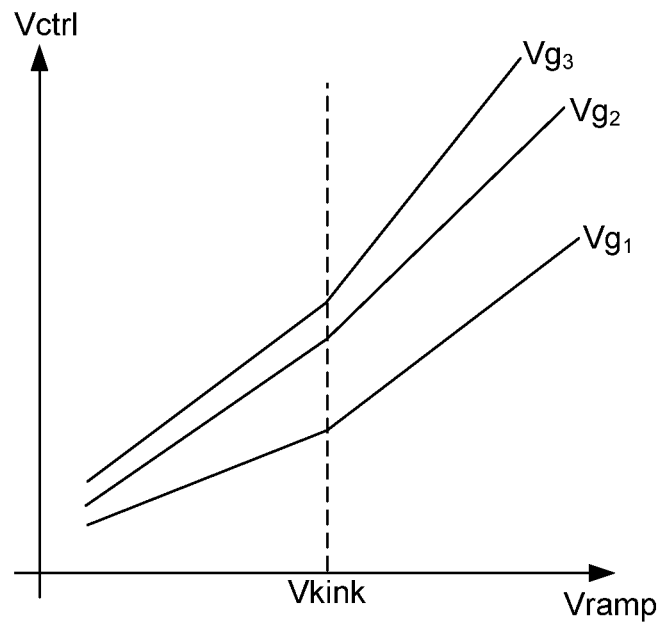
FIG. 10B is a graph of characteristics of a gate power control scheme using multiple control ports in the signal path.
Figure 11:
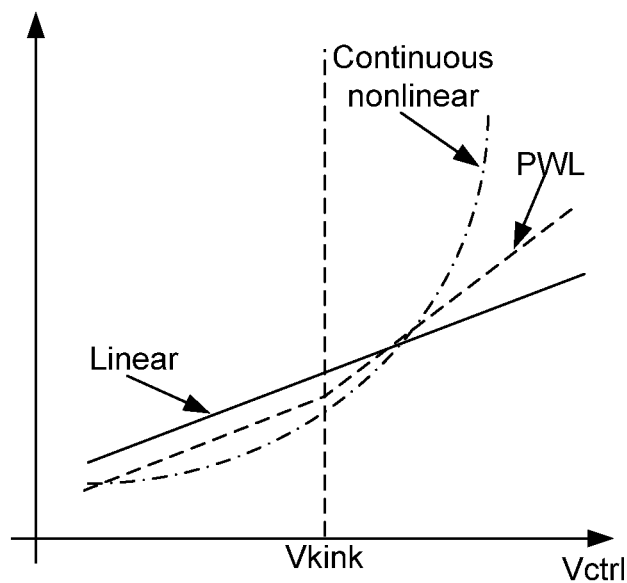
FIG. 11 is a graph of characteristics of independent control curves.

Using multiple power control paths may be very instrumental in optimizing PA performance, particularly at backed-off power levels. The exemplary and non-limiting FIG. 10A depicts a multi-port power control implementation for a cascode output stage configuration. The power control block 1150 generates different control signals for: the last driver 1110 with supply biasing (Idrv or Vdrv), the main output stage 1120 gate ($Vg_1$) if AC coupled, and the cascode gates of the output stage ($Vg_2$, $Vg_3$, etc.) as may be necessary. In general each control port has its own control curve generator such as 1160, 1170 and 1180. FIG. 10B shows an example of control curves for the multi-port power control scheme. They may be linear dependencies of the Vramp targeted by using nonlinear control curves as a function of Vramp. Piece-wise linear characteristics having one or more inflection points can be used as shown in FIG. 10B. The inflection points of different curves may be aligned or they may have different values. Also, continuous nonlinear characteristics may be used, providing a smoother power control characteristic. In one embodiment of the invention a gate power control scheme in which multiple feedback gains are set for the different control ports. In this case it could be expected to have different curve characteristics for each feedback gain as shown, for example, with respect of the curves in FIG. 11.

Figure 12:
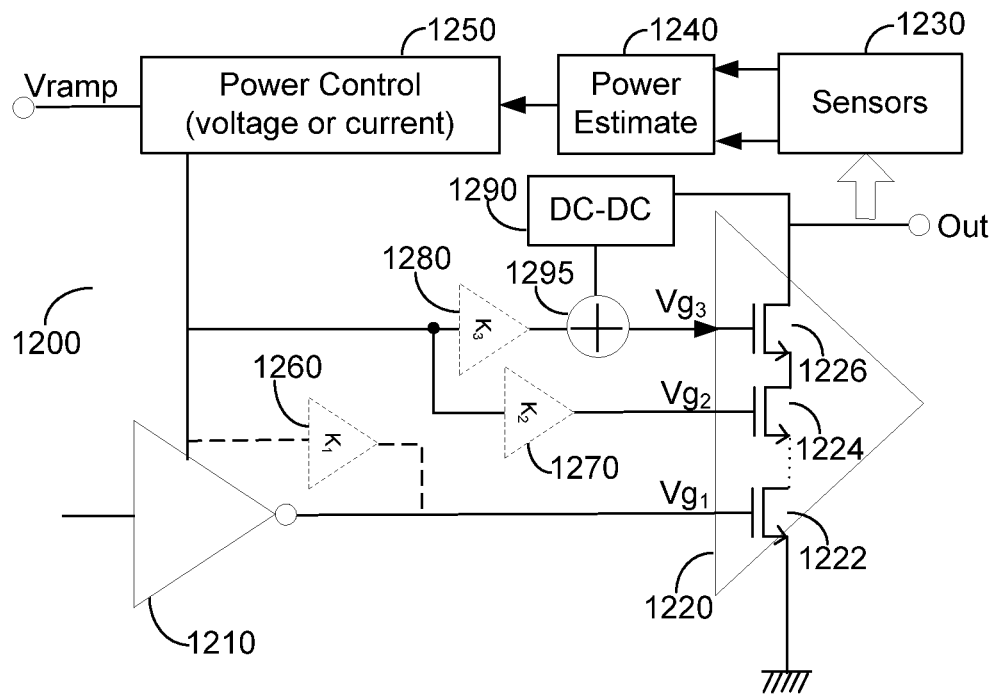
FIG. 12 is a block diagram of single feedback multiple forward gate power control scheme.

Exemplary and non-limiting FIG. 12 shows an alternative implementation of the multi-port gate power control scheme using both feedback and feed-forward control signal generation. The main output of the power control loop 1250 is the bias signal for the last driver stage 1210. This can be either a voltage (Vdrv) or a current (Idrv). All the output stage 1220 gates (main and cascode) controls are generated in feed-forward manner starting from the local supply of the last driver 1210. The individual bias generators $K_1$ 1260, $K_2$ 1270, and $K_3$ 1280, may use linear, piece-wise linear or even continuous nonlinear characteristics. The intrinsic current to voltage conversion given by the last driver 1210, which is current biased, results in a simplification of the multiple port control curve generation. However, in this case the different control port signals are not independently set one from the other. Their interdependencies restrict the optimization range somewhat. However in some cases the variation range may be wide enough, while the simplification may constitute the advantage.

Figure 13:
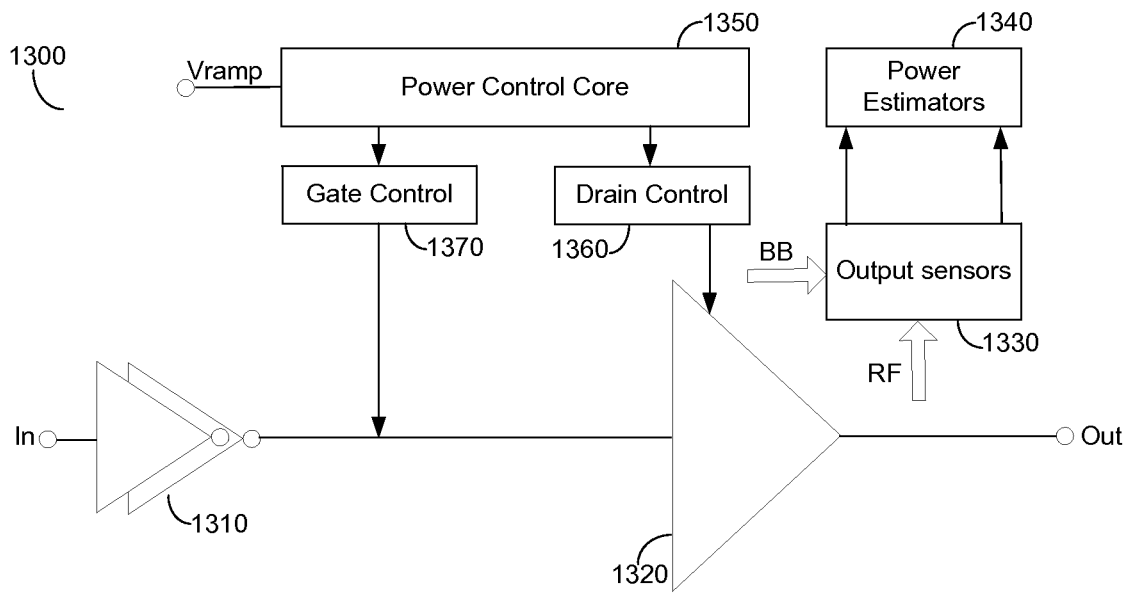
FIG. 13 is a block diagram of PA power control using a hybrid gate and drain power control scheme.

The gate power control scheme may be used as an alternative to the drain (collector) power control schemes, bringing size, cost and performance advantages. Another possibility is to combine the gate 1370 and drain power 1360 control into a hybrid control scheme as shown in the exemplary and non-limiting FIG. 13. The hybrid power control may use one of the techniques (gate or drain) as the main one and the other one as auxiliary. Alternatively both techniques may contribute in equal share. Yet another alternative is to use one technique for a given power range, e.g., drain control at low and moderate output power levels, and the other technique for other power ranges (e.g. gate control at high power levels). The two ranges may overlap or not. Furthermore, the output sensors can use any combination of RF sensors and modulation bandwidth, baseband, sensors. The power estimation based on the sensed output voltage and current can use any of existing methods. A good choice is to use a linear voltage and current summation which offers simplicity and flexibility.

Figure 14:
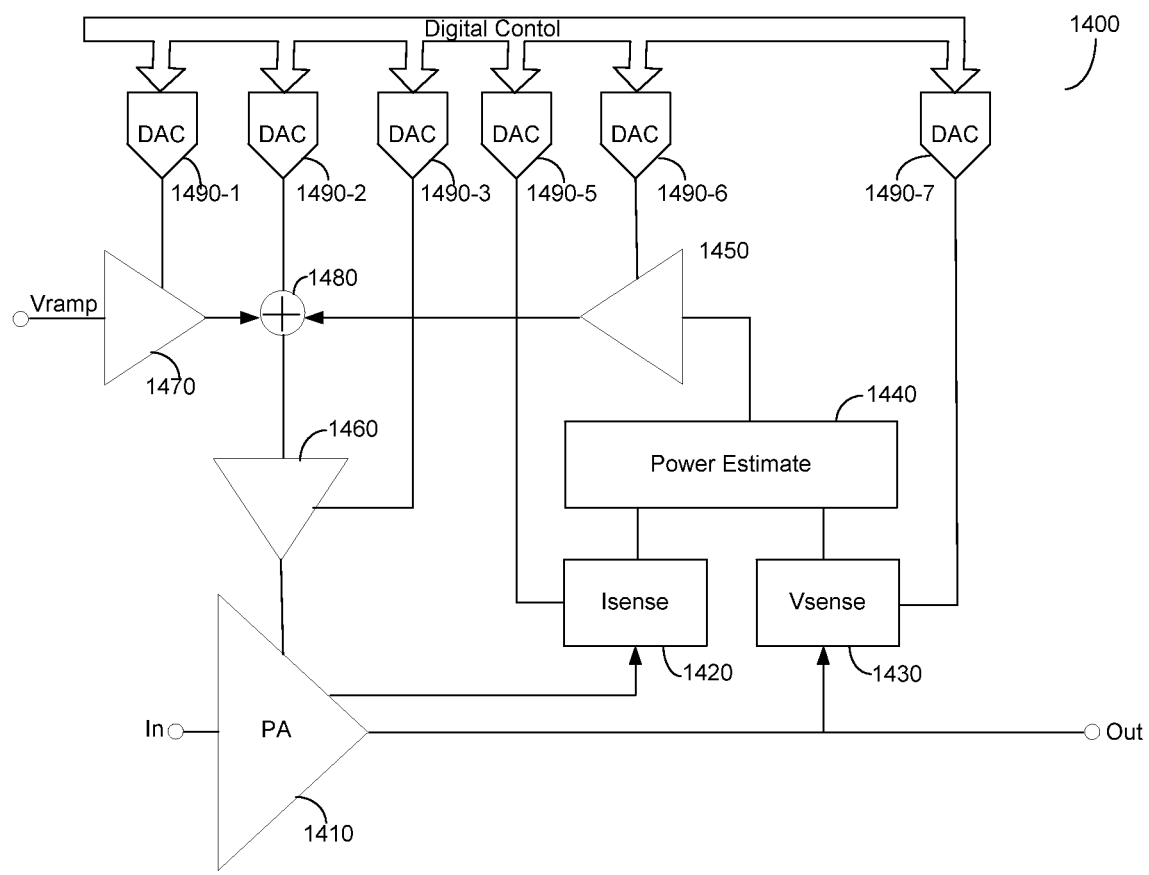
FIG. 14 is a block diagram of a PA power control loop using DACs to provide loop behavior adjustability

Tuning the behaviors of the PA power control loop requires the availability of forward and feedback paths gain adjustments. For a mixed signal PA implementation it is advantageous to provide the desired loop adjustment in a digital fashion using a universal digital IO bus. Digital to analog converters (DAC) are used to convert the incoming control adjustment into an analog signal that can be processed by the PA control loop. Such a technique provides significant simplifications of the control scheme since a single I/O bus can be used to access many DACs in a sequential fashion. The I/O bus can be also used for other control, test, debug, and tuning functions, just to name a few. The exemplary and non-limiting FIG. 14 presents an exemplary embodiment of the DAC controlled PA power control loop. Such implementations are particularly useful for the CMOS PA integration where the DACs and the digital I/O bus logic take a very small area. The digital I/O bus controls a whole slew of DACs 1490, each having its own access registers. The DAC control can be used to change either the slope (gain) of a given characteristic or its offset value. Using such DAC controls can allow an easy optimization of the PA performance post fabrication. After the optimum adjustment settings are found, the DACs may be replaced with constant sources (voltage, current, etc.) and thus some cost reduction in a subsequent tape-out. Alternatively, the DACs can be used to provide an adaptive adjustment of the power control loop in multi-band and/or multi-mode operation (e.g. WCDMA and GSM), each mode of operation having specific output power levels. The DACs may be also controlled by additional loops that are sensitive to the environment variables such as: supply voltage, temperature, process, power level, frequency band, communication standard, load impedance, frequency range, output power range, etc. by means of detectors that provide such information.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. A power amplifier (PA) system comprising:
   a radio frequency (RF) signal path comprising a plurality of gain stages each gain stage having at least an input gate of a metal-oxide semiconductor (MOS) transistor; and
   a power control unit coupled to combine with an input gate of at least two of the plurality of gain stages, wherein the power control unit is adapted to deliver a different control signal to each one of the coupled input gates of the at least two of the plurality of gain stages.

2. The PA system of claim 1, wherein at least one of the coupled input gates of the at least two of the plurality of gain stages is one of: a main gate of an output stage of the RF signal path, a cascode gate of the output stage of the RF signal path.

3. The PA system of claim 1, further comprising a drain control port for drain power control.

4. The PA system of claim 1, wherein the gate-based power control unit operates in an open-loop mode.

5. The PA system of claim 1, wherein the gate-based power control unit operates in a closed-loop mode.

6. The PA system of claim 5, further comprising:
   at least a sensor for sensing an output power of the PA system; and
   a power estimator providing an power estimation to the power control unit respective of at least the sensed output power.

7. A method for controlling power of a power amplifier (PA) system comprising:
   controlling the power of at least an input gate of a metal-oxide semiconductor (MOS) transistor of at least two power amplifier stages of the power amplifier system using a power control unit that is coupled to combine with an input gate of at least two of a plurality of gain stages feeding into the at least two power amplifier stages, wherein the power control unit is adapted to deliver a different control signal to each one of the coupled input gates of the at least two of the plurality of gain stages.

8. The method of claim 7, wherein at least one of the coupled input gates of the at least two of the plurality of gain stages is one of: a main gate of an output stage of the signal path, a cascode gate of the output stage of the signal path.

9. The method of claim 7, wherein the power control unit operates in an open-loop mode.

10. The method of claim 7, wherein the power control unit operates in a closed-loop mode.

11. The method of claim 10, further comprising:
    sensing an output power of the PA system;
    estimating the power of the PA system; and
    providing the power estimation to the power control unit.

12. A power amplifier (PA) system comprising:
    a radio frequency (RF) path; and
    a power control unit comprising one or more RF output sensors, wherein the power control unit is coupled to an input gate of a metal-oxide semiconductor (MOS) transistor of at least two of a plurality of gain stages in the RF path, and further wherein the power control unit is adapted to deliver a different control signal to each one of the coupled input gates of the at least two of the plurality of gain stages.

13. The PA system of claim 12, wherein the power control block performs RF to baseband conversion of at least a signal sensed by the one or more RF output sensors by at least one of: mixing with an independent clock signal, self-mixing, sub-sampling, over-sampling, non-linear distortion.

14. A power amplifier (PA) system comprising:
    a radio frequency (RF) signal path;
    a power control unit, wherein the power control unit is coupled to an input gate of a metal-oxide semiconductor (MOS) transistor of at least two of a plurality of gain stages in the RF signal path, and further wherein the power control unit is adapted to deliver a different control signal to each one of the coupled input gates of the at least two of the plurality of gain stages; and
    one or more supplemental control ports for controlling power of the PA system.

15. The PA system of claim 14, wherein the one or more supplemental control ports are driven by one or more of: a load impedance sensor, a temperature sensor, a phase angle sensor, a supply voltage sensor, a process sensor, a power range sensor, and a frequency range sensor.

* * * * *